United States Patent
Tsai et al.

(10) Patent No.: US 10,170,459 B1
(45) Date of Patent: Jan. 1, 2019

(54) METHODS FOR AN ESD PROTECTION CIRCUIT INCLUDING A FLOATING ESD NODE

(71) Applicant: GLOBALFOUNDRIES Singapore Pte. Ltd., Singapore (SG)

(72) Inventors: Tsung-Che Tsai, Singapore (SG); Manjunatha Govinda Prabhu, Clifton Park, NY (US); Vaddagere Nagaraju Vasantha Kumar, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/620,207

(22) Filed: Jun. 12, 2017

(51) Int. Cl.
*H01L 27/02* (2006.01)
*H01L 21/8249* (2006.01)
*H01L 27/06* (2006.01)
*H01L 21/8234* (2006.01)

(52) U.S. Cl.
CPC .. *H01L 27/0251* (2013.01); *H01L 21/823431* (2013.01); *H01L 21/823481* (2013.01)

(58) Field of Classification Search
CPC ............. H01L 27/0259; H01L 27/0623; H01L 21/8249
See application file for complete search history.

(56) References Cited

U.S. PATENT DOCUMENTS

| | | | | |
|---|---|---|---|---|
| 2006/0273389 A1* | 12/2006 | Cohen | .................... | B82Y 10/00 257/331 |
| 2007/0158748 A1* | 7/2007 | Chu | .................... | H01L 27/0288 257/355 |
| 2012/0119331 A1* | 5/2012 | Gendron | ............. | H01L 27/0262 257/587 |
| 2016/0064371 A1* | 3/2016 | Lee | .................... | H01L 27/0259 257/378 |
| 2016/0260700 A1* | 9/2016 | Huang | ................ | H01L 27/0255 |

* cited by examiner

*Primary Examiner* — Changhyun Yi
(74) *Attorney, Agent, or Firm* — Ditthavong & Steiner, P. C.

(57) ABSTRACT

Methods to forming low trigger-voltage ESD protection circuit in FinFET IC devices and resulting devices. Embodiments include providing a substrate including a first-type well area in an ESD region; forming a base junction of the first-type along the perimeter of the ESD region; forming a shallow trench isolation (STI) region adjacent the base junction; forming alternate emitter and collector junctions of a second-type adjacent the STI region, parallel to and spaced from each other by parallel additional STI regions; forming at least one gate perpendicular to and over a collector junction; and forming a floating ESD nodes of the first-type in the collector junction adjacent one side of the at least one gate.

11 Claims, 3 Drawing Sheets

US 10,170,459 B1

METHODS FOR AN ESD PROTECTION CIRCUIT INCLUDING A FLOATING ESD NODE

TECHNICAL FIELD

The present disclosure relates generally to designing and fabricating integrated circuit (IC) devices. The present disclosure is applicable to forming an electrostatic discharge (ESD) protection circuit for use in fin-type field-effect transistor (FinFET) IC devices in the 10 nanometer (nm) technology node and beyond.

BACKGROUND

Generally, IC devices include ESD protection circuits to divert and discharge high electrical currents caused by ESD events, which may occur during normal use of the devices, for example, when input/output terminals of an IC device are connected to other devices or circuits. Without ESD protection circuits, the high electrical currents may cause malfunction or physical damage in an IC device. Advanced IC devices utilizing FinFET technology also need and utilize ESD protection circuitry; however, traditional ESD circuits require larger silicon area and additional process steps for implementation, are limited to a fixed ESD trigger voltage (Vt1), and may be ineffective in providing sufficient protection against an ESD event. In one example, the trigger-voltage (Vt1) in an ESD circuitry may be same as the junction breakdown voltage (e.g., N-P, P-N) in an ESD circuit. As a result, the ESD circuit may be unable to effectively protect the other devices/elements from the ESD event. FIG. 1 illustrates another example solution, where an "ESD implant" 101 may be utilized to reduce the Vt1 at the collector side of the ESD device; however, this solution would require an additional fabrication mask, adding to the fabrication process.

Therefore, a need exists for methodology enabling formation of an efficient and effective ESD protection circuit for FinFET devices and the resulting devices.

SUMMARY

An aspect of the present disclosure is a method for forming a low trigger-voltage ESD protection circuit in FinFET IC devices.

Another aspect of the present disclosure is an ESD protection circuit having a low trigger-voltage for FinFET IC devices.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing a substrate including a first-type well area in an ESD region; forming a base junction of the first-type along the perimeter of the ESD region; forming a shallow trench isolation (STI) region adjacent the base junction; forming alternate emitter and collector junctions of a second-type adjacent the STI region, parallel to and spaced from each other by parallel additional STI regions; forming at least one gate perpendicular to and over a collector junction; and forming a floating ESD nodes of the first-type in the collector junction adjacent one side of the at least one gate.

In one aspect, the at least one gate is at a middle or one end of the collector junction.

One aspect includes forming the ESD node epitaxially.

An additional aspect includes determining a gate-length based on a target ESD event trigger-voltage.

In another aspect, a shorter gate-length reduces the trigger-voltage.

In a further aspect, the first-type is p-type and the second-type is n-type.

In additional aspect, the first-type is n-type and the second-type is p-type.

Another aspect of the present disclosure includes a device including: a substrate including a first-type well area in an ESD region; a base junction of the first-type along the perimeter of the ESD region; a shallow trench isolation (STI) region adjacent the base junction; alternate emitter and collector junctions of a second-type adjacent the STI region, parallel to and spaced from each other by parallel additional STI regions; at least one gate perpendicular to and over a collector junction; and a floating ESD node of the first-type in the collector junction adjacent one side of the at least one gate.

In one aspect, the at least one gate is at a middle or one end of the collector junction.

One aspect includes a gate-length based on a target ESD event trigger-voltage.

In another aspect, a shorter gate-length reduces the trigger-voltage.

In a further aspect, the first-type is p-type and the second-type is n-type.

In additional aspect, the first-type is n-type and the second-type is p-type.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problems of inefficient ESD protection circuits for FinFET based IC devices and a requirement for additional fabrication masks and/or increased silicon area to increase the efficiency of the ESD protection circuits. The present disclosure addresses and solves such problems, for instance, by, inter alia, adding a floating ESD node to a collector junction, and controlling a Vt1 of the ESD circuit by varying a length of a gate in the collector junction of the ESD circuit.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
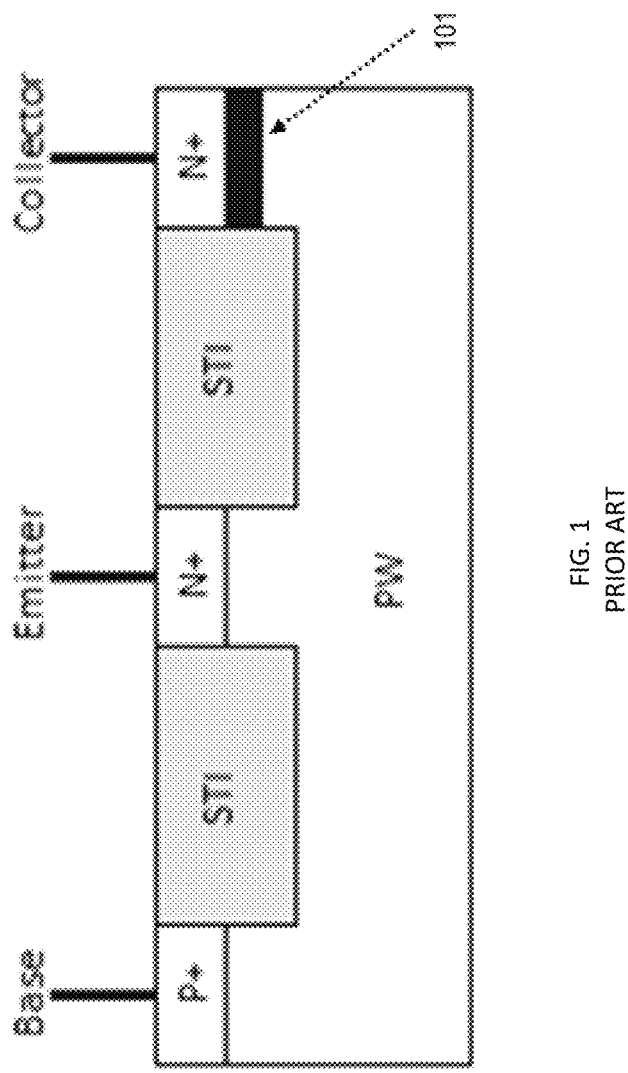
FIG. 1 illustrates a conventional example ESD solution.
Figure 2A:
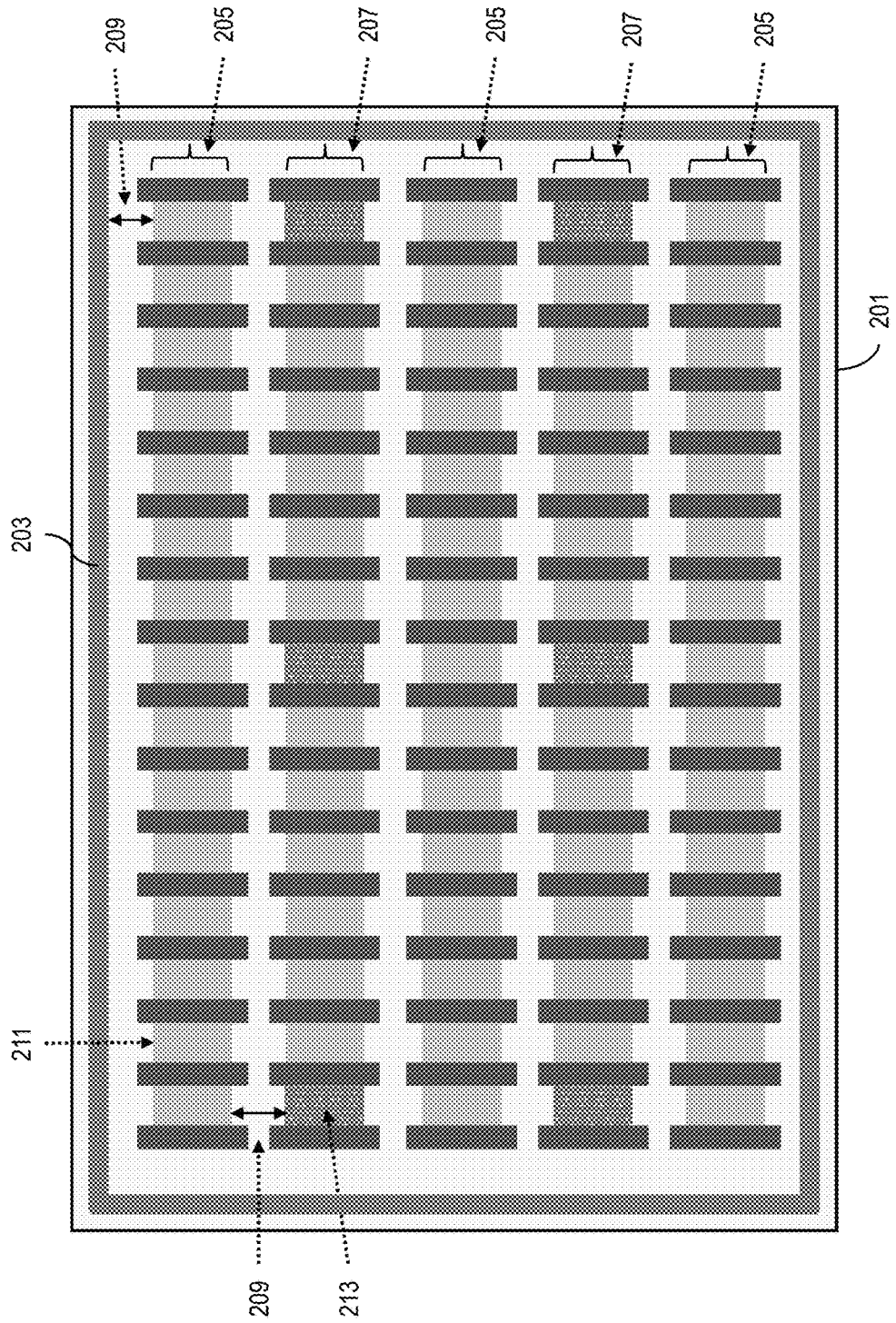
FIGS. 2A and 2B illustrate top views of layouts of ESD protection circuits including floating ESD nodes, in accordance with an exemplary embodiment.

FIG. 2A illustrates a top view of substrate 201 including base 203, emitter 205, and collector 207 junction areas over the substrate. The junction areas 203, 205, and 207 are separated by STI regions 209 as in the conventional ESD circuit of FIG. 1. In a scenario where the ESD circuit is based on NPN transistors, the substrate 201 and the base junction 203 would be of p-type, the emitter and collector channels 211 of n-type, and floating nodes 213 of p-type would be formed in the collector junctions 207 for enhanced ESD performance. Alternatively, where the ESD circuit is based on PNP transistors, the substrate 201 and the base junction 203 would be of n-type, the emitter and collector channels 211 would be of p-type, and floating nodes 213 of n-type would be formed in the collector junctions 207 for enhanced ESD performance. A floating node may be epitaxially formed in the collector junctions and further implanted with a proper (e.g., n-type or p-type) dopant material.

Figure 2B:
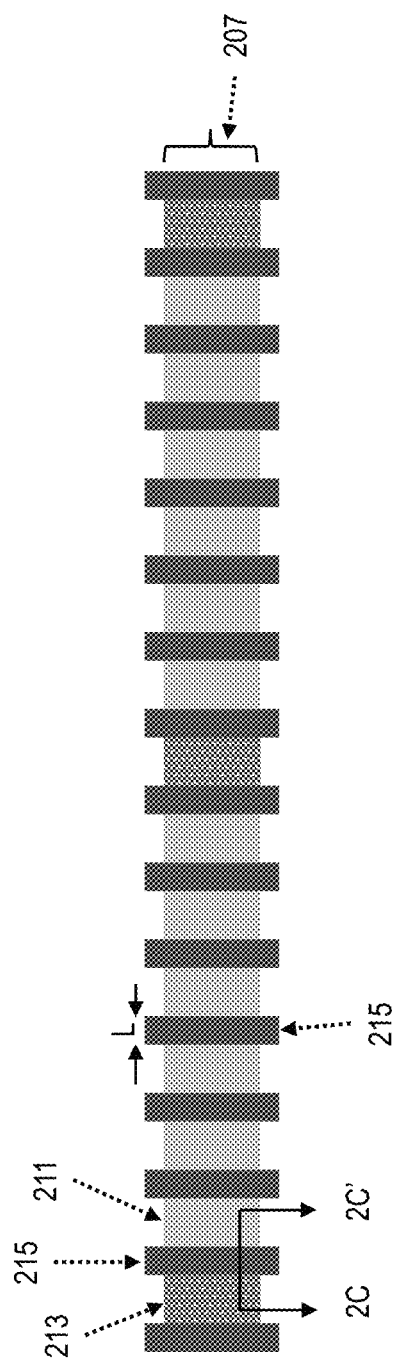

FIG. 2B illustrates a collector junction 207 including n-type channel 211, p-type ESD node 213, and gate contact 215. A Vt1 of an ESD circuit may be controlled/adjusted by changing a gate-length "L" of the gate contact 215. For example, a smaller gate-length would lower the Vt1 such that the ESD circuit would be activated at a lower voltage, due to an ESD event, for protecting other devices/elements.

Figure 2C:
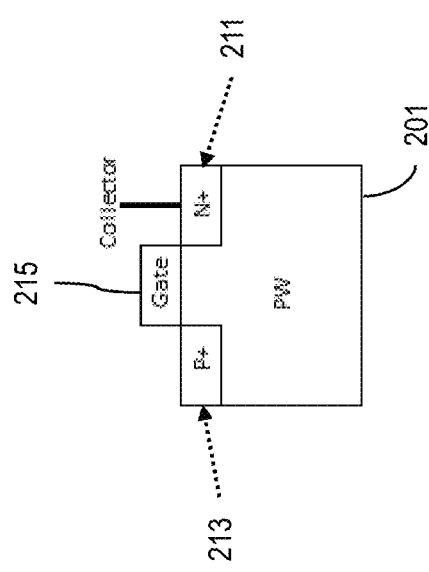
FIG. 2C illustrates a cross-sectional view a floating ESD node, in accordance with an exemplary embodiment.

FIG. 2C is cross-sectional view, along 2C-2C' of FIG. 2B, illustrating a p-type substrate 201, an n-type channel 211, a p-type floating node 213, and a gate contact 215.

The embodiments of the present disclosure can achieve several technical effects including an ESD protection circuit for FinFET based IC devices with a lower trigger-voltage, which may be controlled by adjusting a gate-length. Implementation of the ESD circuit would not require any additional masks or silicon area. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a substrate including a first-type well area in an electrostatic discharge (ESD) region;
forming a base junction of the first-type along the perimeter of the ESD region;
forming a shallow trench isolation (STI) region adjacent the base junction;
forming alternate emitter and collector junctions of a second-type adjacent the STI region, parallel to and spaced from each other by parallel additional STI regions;
forming at least one gate perpendicular to and over a collector junction;
epitaxially forming a floating ESD node of the first-type in the collector junction adjacent one side of the at least one gate; and
determining a gate-length based on a target ESD event trigger-voltage, wherein a shorter gate-length reduces the trigger-voltage such that the ESD region is activated at a lower voltage.

2. The method according to claim 1, wherein:
the at least one gate is at a middle or one end of the collector junction.

3. The method according to claim 1, wherein:
the first-type is p-type and the second-type is n-type.

4. The method according to claim 1, wherein:
the first-type is n-type and the second-type is p-type.

5. A device comprising:
a substrate including a first-type well area in an electrostatic discharge (ESD) region;
a base junction of the first-type along the perimeter of the ESD region;
a shallow trench isolation (STI) region adjacent the base junction;
alternate emitter and collector junctions of a second-type adjacent the STI region, parallel to and spaced from each other by parallel additional STI regions;
at least one gate perpendicular to and over a collector junction;
a floating ESD node of the first-type in the collector junction adjacent one side of the at least one gate; and
a gate-length based on a target ESD event trigger-voltage, wherein a shorter gate-length reduces the trigger-voltage such that the ESD region is activated at a lower voltage.

6. The device according to claim 5, wherein:
the at least one gate is at a middle or one end of the collector junction.

7. The device according to claim 5, wherein:
the first-type is p-type and the second-type is n-type.

8. The device according to claim 5, wherein:
the first-type is n-type and the second-type is p-type.

9. A method comprising:
  providing a substrate including a first-type well area in an electrostatic discharge (ESD) region;
  forming a base junction of the first-type along the perimeter of the ESD region;
  forming a shallow trench isolation (STI) region adjacent the base junction;
  forming alternate emitter and collector junctions of a second-type adjacent the STI region, parallel to and spaced from each other by parallel additional STI regions;
  forming multiple gates perpendicular to and over a collector junction;
  epitaxially forming a floating ESD node of the first-type at middle and at each end of each collector junction; and
  determining a gate-length based on a target ESD event trigger-voltage, wherein a shorter gate-length reduces the trigger-voltage such that the ESD region is activated at a lower voltage.

10. The method according to claim 9, wherein:
  the first-type is p-type and the second-type is n-type.

11. The method according to claim 9, wherein:
  the first-type is n-type and the second-type is p-type.

* * * * *